US008860453B2

(12) United States Patent
Leino et al.

(10) Patent No.: US 8,860,453 B2
(45) Date of Patent: Oct. 14, 2014

(54) TEST ADAPTER CONFIGURATION FOR TESTING A COMMUNICATION DEVICE

(75) Inventors: Loit Leino, Västriku (EE); Priidel Eiko, Aru (EE); Madis Kerner, Tammsaare Lee (EE)

(73) Assignee: JOT Automation Oy, Oulu (FI)

( * ) Notice: Subject to any disclaimer, the term of this patent is extended or adjusted under 35 U.S.C. 154(b) by 754 days.

(21) Appl. No.: 13/062,993

(22) PCT Filed: Sep. 17, 2009

(86) PCT No.: PCT/FI2009/050746
§ 371 (c)(1),
(2), (4) Date: Jun. 3, 2011

(87) PCT Pub. No.: WO2010/031904
PCT Pub. Date: Mar. 25, 2010

(65) Prior Publication Data
US 2011/0227597 A1    Sep. 22, 2011

(30) Foreign Application Priority Data
Sep. 18, 2008    (FI) ................................... 20085881

(51) Int. Cl.
*G01R 31/00*    (2006.01)
*H04M 1/24*    (2006.01)
*G01R 1/04*    (2006.01)

(52) U.S. Cl.
CPC ............... *H04M 1/24* (2013.01); *G01R 1/0408* (2013.01)
USPC ................. 324/756.07; 324/756.05

(58) Field of Classification Search
CPC ............. G01R 31/312; G01R 31/2896; G01R 31/2863; G01R 31/2809; G01R 1/458
See application file for complete search history.

(56) References Cited

U.S. PATENT DOCUMENTS

| 4,922,191 A | 5/1990 | Conover |
| 5,218,294 A | 6/1993 | Soiferman |
| 5,349,640 A | 9/1994 | Dunn et al. |
| 6,119,255 A * | 9/2000 | Akram ........................ 714/724 |
| 6,170,329 B1 | 1/2001 | Steketee |
| 6,181,146 B1 | 1/2001 | Koyama |
| 6,229,490 B1 | 5/2001 | Hofmann et al. |

(Continued)

FOREIGN PATENT DOCUMENTS

| CN | 1755374 A | 4/2006 |
| CN | 2881652 Y | 3/2007 |

(Continued)

OTHER PUBLICATIONS

Tapani Salonen, International Search Report for corresponding International Application No. PCT/FI2009/050746, Jan. 5, 2010.

(Continued)

*Primary Examiner* — Minh N Tang
(74) *Attorney, Agent, or Firm* — Hoffmann & Baron, LLP

(57) ABSTRACT

The invention provides a base plate for a test adapter for use in testing devices in a production line. The base plate comprises a first interface configured to connect to a product-specific part configured to receive and test a specific type of device under test, and a second interface configured to connect to a common part comprising testing elements common to various devices under test. The base plate is a printed wiring board arranged to couple signals from the common part to the device under test.

15 Claims, 2 Drawing Sheets

(56) References Cited

U.S. PATENT DOCUMENTS

| | | | |
|---|---|---|---|
| 6,891,384 B2 * | 5/2005 | Mardi et al. | 324/754.03 |
| 7,737,715 B2 | 6/2010 | Tilbor et al. | |
| 2004/0017216 A1 | 1/2004 | Mardi et al. | |

FOREIGN PATENT DOCUMENTS

| CN | 101201387 A | 6/2008 |
|---|---|---|
| FI | 20045431 | 5/2006 |
| FI | FI119529 A | 12/2008 |
| WO | WO0241017 A1 | 5/2002 |
| WO | WO2005054877 A1 | 6/2005 |

OTHER PUBLICATIONS

Jorma Lehtonen, Finnish Search Report for corresponding Finnish Application No. 20085881, p. 1, Jul. 29, 2009.

Official Action issued concerning CN 200980136593.1, pp. 1-17, Feb. 1, 2013.

Supplementary European Search Report, Application No. EP 09 81 4143, May 23, 2014, 2 pages.

* cited by examiner

TEST ADAPTER CONFIGURATION FOR TESTING A COMMUNICATION DEVICE

CROSS-REFERENCE TO RELATED APPLICATIONS

This application is a National Phase application of International Application No. PCT/FI2009/050746, filed Sep. 17, 2009, which claims priority to Finnish Application No. 20085881, filed Sep. 18, 2008, which are incorporated herein by reference in their entirety.

BACKGROUND

1. Field

The invention relates to the field of testing communication devices and, particularly, to a test adapter configuration to perform such testing.

2. Description of the Related Art

In order to ensure high quality and to reduce failures of manufactured communication devices, e.g. mobile phones, various testing processes are carried out on a production line. A testing station operates in production lines or as a stand-alone station in a product development environment. A testing cell tests various interfaces of communication devices, such as radio frequency communication, audio and user interfaces. All functions of the testing cell needed for the testing processes are typically automated.

Different devices under test (DUT) have different features to be tested, such as displays, keypads, various test pads and sockets, cameras, speakers, microphones, antennas, sensors, vibration, power, data transferring interfaces, and other interfaces (charger, audio sockets, etc.). Also, different DUTs have different alignment, positioning and fixing possibilities because of their different shapes and different locations of keypads, etc. In order to enable testing of different DUTs with the same testing station, test adapters are used.

A test adapter is a DUT-specific component which functions as an adapter between the testing station and the DUT of a specific type. In general, the test adapter comprises a base plate and two basic interfaces arranged on the base plate. The first interface is a DUT interface with all alignment, positioning and locking components (mechanical interface). The second interface is a testing station interface with its own locating and locking elements and with all necessary electrical, RF and pneumatic connectors needed for testing the DUT. The DUT interface is customizable and depends on the DUT. This customizable part with the DUT interface and the base plate is called a product-specific part of the test adapter. The testing cell interface of the test adapter may be common to all test adapters and, therefore, it may be referred to as a common part.

DUTs become more functional, as the technology advances. This results in an increase in the number of test features and parts used in test adapters. Depending on the DUT, test adapters have a various number of brackets, test probe holders, different couplers with ground boxes and their own fixing brackets, screws, pneumatic actuators, etc. Accordingly, the number of electrical wires, pneumatic tubes, connection elements to connect additional testing parts, e.g. an antenna coupler and test probes, etc. increases. This increase in the number of testing elements to be connected to the test adapter before the testing can be started results in an increased size of the test adapter, and connecting the numerous wires, tubes, and connection elements to the test adapter is very time-consuming and slows down the testing process. Accordingly, the testing process and the performance of the testing station and the whole production line need improvement.

SUMMARY

An object of the present invention is to reduce the number of wires needed to connect a testing station with a product-specific part of a test adapter. This object is achieved by providing a base plate for a test adapter for use in a testing station of a production line, the base plate establishing an electric connection between the testing station and the product-specific part.

According to an aspect of the present invention, there is provided a base plate for a test adapter configured to enable testing of various devices in a testing station, the base plate comprising: a first interface configured to connect to a product-specific part configured to receive and test a specific type of device under test; and a second interface configured to connect to a common part comprising testing elements common to various devices under test, wherein the base plate is a printed wiring board arranged to route electrical connections from the common part to testing elements of the product-specific part used for testing said device under test.

According to another aspect of the present invention, there is provided a test adapter test adapter, comprising: a base plate configured to be applied to a test adapter configured to enable testing of various devices in a testing station; a product-specific part arranged on the base plate and configured to receive and test a specific type of device under test; and a common part connectable to the base plate and comprising testing elements common to various devices under test, wherein the base plate comprises a first interface configured to connect to a product-specific part configured to receive and test a specific type of device under test; and a second interface configured to connect to a common part comprising testing elements common to various devices under test, wherein the base plate is a printed wiring board arranged to route electrical connections from the common part to testing elements of the product-specific part used for testing said device under test.

According to another aspect of the present invention, there is provided a testing station comprising a test adapter configured to enable testing of various devices in the testing station, comprising a base plate; a product-specific part arranged on the base plate and configured to receive and test a specific type of device under test; and a common part connectable to the base plate and comprising testing elements common to various devices under test, wherein the base plate comprises a first interface configured to connect to a product-specific part configured to receive and test a specific type of device under test; and a second interface configured to connect to a common part comprising testing elements common to various devices under test, wherein the base plate is a printed wiring board arranged to route electrical connections from the common part to testing elements of the product-specific part used for testing said device under test.

According to yet another aspect of the present invention, there is provided a production line comprising a testing station comprising a test adapter configured to enable testing of various devices in the testing station, the test adapter comprising a base plate; a product-specific part arranged on the base plate and configured to receive and test a specific type of device under test; and a common part connectable to the base plate and comprising testing elements common to various devices under test, wherein the base plate comprises a first interface configured to connect to a product-specific part configured to receive and test a specific type of device under test; and a second interface configured to connect to a common part comprising testing elements common to various devices under test, wherein the base plate is a printed wiring board arranged to route electrical connections from the common part to testing elements of the product-specific part used for testing said device under test.

Embodiments of the invention are defined in the dependent claims.

BRIEF DESCRIPTION OF THE DRAWINGS

Embodiments of the present invention are described below, by way of example only, with reference to the accompanying drawings, in which.

DETAILED DESCRIPTION

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

As mentioned above, a problem of prior art solutions is the amount of electrical wires that have to be connected to the product-specific part every time the product-specific part (or the whole test adapter) is changed. The present invention overcomes this problem by providing a test adapter comprising a base plate for connecting a product-specific part and a common part to each other, wherein the base plate is a printed wiring board arranged to couple signals from the common part to a device under test (DUT). The DUT may be a wireless communication device, such as a mobile phone.

Figure 1:
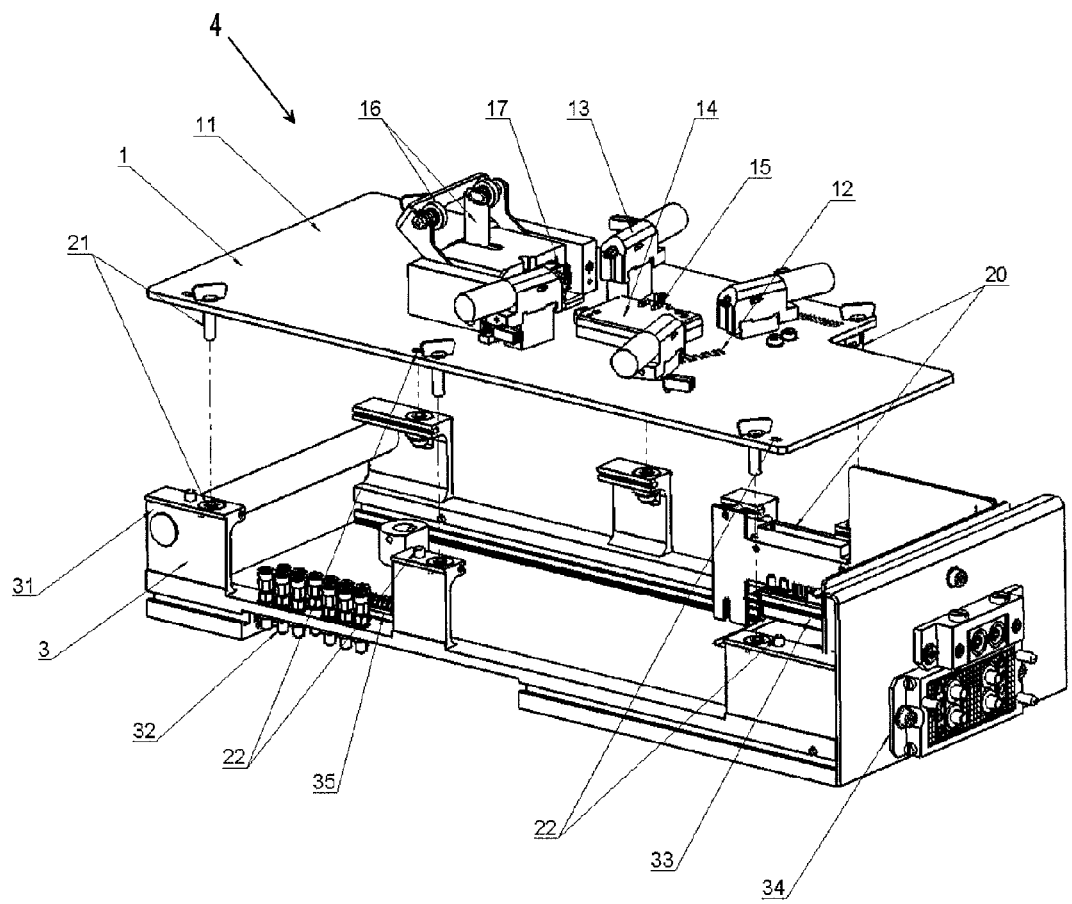
FIG. 1 illustrates the structure of a test adapter according to an embodiment of the invention.

FIG. 1 illustrates an embodiment of the test adapter. The test adapter comprises a common part 3 and a product-specific part 4. The product-specific part 4 is built on a base plate 1 having a top surface 11. The base plate 1 is a printed wiring board (PWB), wherein the wiring is used to route electrical connections from a connector 20 to elements of the product-specific part 4. The printed wiring may be arranged to transfer all electric signals between the common part (and/or the testing station) and the product-specific part. The base plate illustrated in FIG. 1 comprises only one connector 20, but the number of connectors may also be higher, depending on the number of electric connections needed, placement of the elements of the product-specific part 4 on the base plate 1, etc. Additionally, the base plate may comprise an antenna 12 arranged as printed wiring on the base plate 1 and arranged to couple radio signals to the DUT.

The elements of the product-specific part 4 may comprise a receiving element 14 on which the DUT is to be disposed for testing, a supporting element 16 arranged to support the DUT disposed on the receiving element 14, and locking elements 13 configured to lock the DUT to its place. Additionally, the product-specific part 4 may comprise test probes 15 detecting the presence and positioning of the DUT (product presence sensors), audio sensors for detecting audio signals produced by the DUT, etc. Moreover, the product-specific part 4 may comprise positioning elements for guiding the positioning and movement of pneumatic actuators. The pneumatic actuators may be connected to the common part 3. Furthermore, the product-specific part may comprise testing elements 17 arranged to apply signals to the DUT and receive signals from the DUT through a signaling connection established with the DUT. According to an embodiment of the invention, at least some of the probes may be embedded on the base plate 1.

As can be seen, the product-specific part 4 is detachably connected to the common part 3 with locking components 21 and locating components 22 disposed on the base plate 1 and in the common part. As illustrated in FIG. 1, the locating components 22 may be realized by alignment holes or recesses in the base plate 1 and protrusions or pins in the corresponding parts of the base plate. The locking components 21 may be realized by quick-disconnect couplers, e.g. plugs arranged on the base plate 1 that are inserted into their counterparts in the common part 3 and twisted to lock the base plate 1 and the product-specific part 4 to the common part 3. As described above, electrical connections between the common part 3 and the product-specific part 4 are established through the connectors 20 arranged on the base plate 1 and the common part. Obviously, the connectors 20 are counterparts to enable the electrical connection.

As a consequence, the base plate 1 and the product-specific part 4 may be easily detached from the common part every time the DUT type is changed. All that needs to be done is to open the locking components 21 and to remove the product-specific part 4 and the base plate 1.

The common part 3 comprises a base frame 31 and interfaces to connect the common part 3 to the product-specific part and to the testing station (not shown) carrying out the testing of the DUT. The base frame may be arranged to enable a mechanical connection to the product-specific part, as described above, and to the testing station. The mechanical connection between the common part 3 and the testing station may be implemented in any manner known in the art. For example, the common part 3 may be a drawer type of a component comprising grooves on the both sides of the common part 3, as illustrated in FIG. 1, and the common part 3 may be inserted into a drawer type of a testing station. The electrical connections between the common part 3 and the testing station may be established through one or more electrical connectors 33, 34, and 35. FIG. 1 illustrates three electrical connectors 33 to 35, but the number and location of the connectors may naturally depend on the implementation. Additionally, the common part 3 may comprise pneumatic connectors 32 connected with pneumatic tubes to the testing station on one side and to the product-specific part 4 on the other side. The common part may also comprise pneumatic actuators to conduct determined test procedures.

Figure 2:
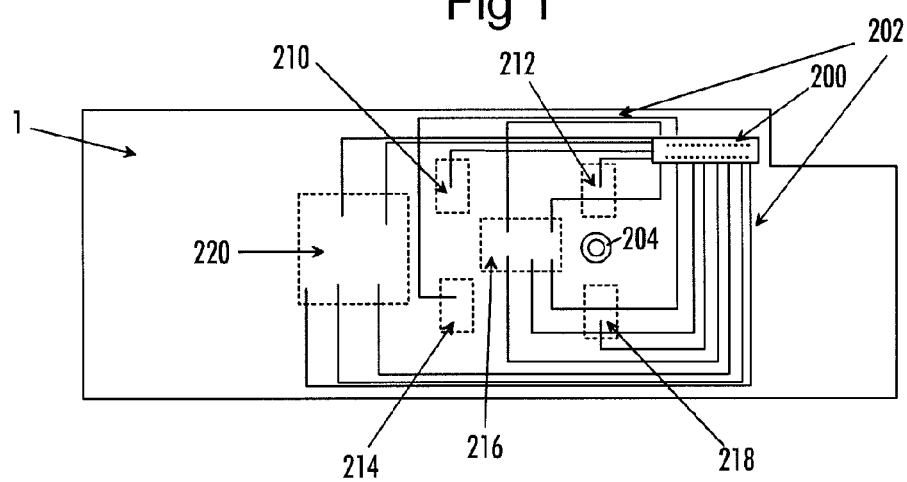
FIG. 2 is a schematic diagram illustrating a base plate of the test adapter illustrated in FIG. 1.

FIG. 2 illustrates an exemplary layout of the base plate 1 illustrated in FIG. 1. FIG. 2 illustrates a connector 200 corresponding to the base plate part of the connector structure 20 illustrated in FIG. 1, locations 210, 212, 214, 216, and 218 for the elements 13 to 17 of the product-specific part 4 and printed wiring 202 forming electric wiring from the connector 200 to the locations of the elements of the product-specific part 4. The base plate 1 may also comprise a radio frequency (RF) connector 204 for the antenna 12 to enable transfer of radio signals between the testing station and the antenna 12. The RF connector 204 may be a BNC connector, e.g. 50- or 75-ohm connector, arranged to receive a coaxial cable transferring the RF signals.

As mentioned above, one or more sensors used in testing the device under test may be embedded on the base plate. The one or more sensors may comprise at least one of the following sensors: a product presence check sensor, actuator position sensor, light sensor for testing display units, vibration sensor for testing the vibration of the DUT (particularly a mobile telephone), etc. The sensors may be soldered on housings in the base plate, and the base plate may comprise wiring from the housing to the connector structure to enable transfer of electric signals.

The base plate 1 may be initially provided without the product-specific elements 14 to 17, i.e. as comprising the printed wiring establishing the routing of signals from the connector 200 to the locations 210 to 220 and the antenna 12. The connectors 200 and 204 may also be provided on the base plate 1. As a consequence, the base plate 1 may be arranged to be specific for a given type of product-specific part. Due to the different physical sizes and different placement of components of the DUTs the product-specific part may be different for each DUT. As a consequence, the base plate may also be different for each product-specific part.

However, the base plate 1 may provide a housing for all possible testing elements, but only those testing elements related to the test procedures to be applied to the product may be attached to the base plate 1. Accordingly, the product-specific part 4 may be custom-built on the base plate 1 according to the test procedures to be carried out. Since the product-specific part 4 is built on the base plate 1, the base plate may be understood to be included in the product-specific part.

Figure 3:
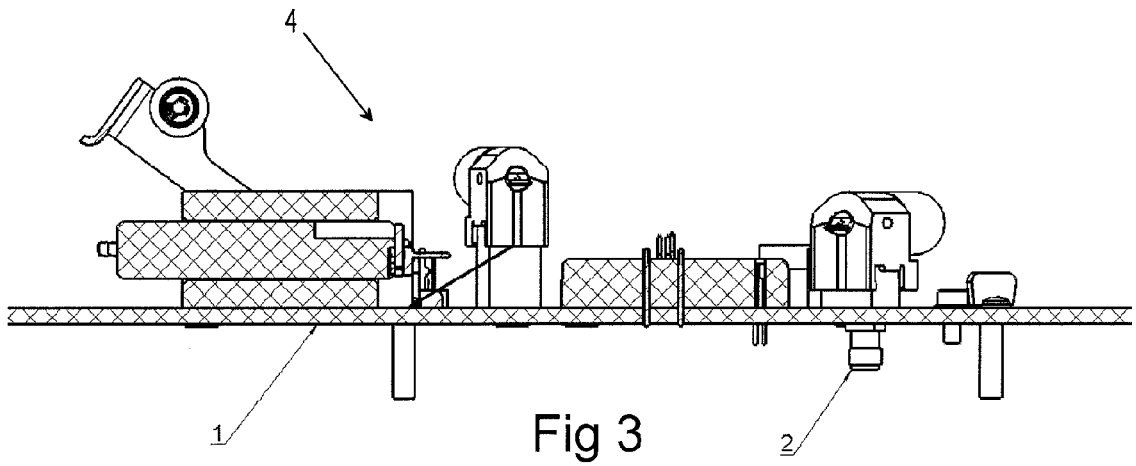
FIG. 3 is a side view of the test adapter of FIG. 1.

FIG. 3 illustrates a side view of the base plate 1 and the product-specific part 4 illustrated in FIG. 1. FIG. 3 also illustrates the RF connector 2 in more detail.

Figure 4:
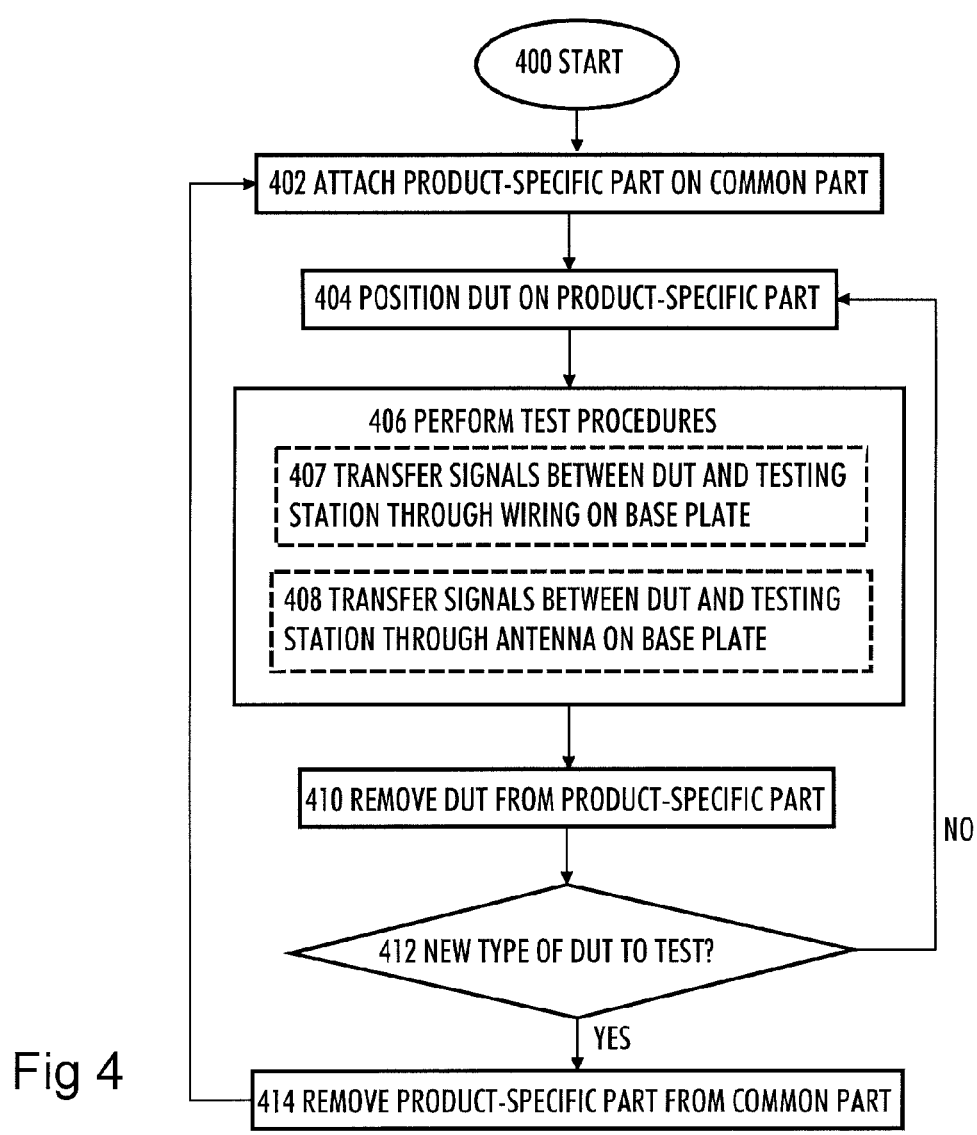
FIG. 4 illustrates a testing process for testing a device under test by using the test adapter according to an embodiment of the invention.

Next, let us consider a testing process for testing the DUT when using the test adapter according to an embodiment of the invention with reference to FIG. 4. The process starts in block 400. Let us consider that a common part of the test adapter according to an embodiment of the invention is connected to a testing station, but no product-specific part is yet connected to the common part. In block 402, a product-specific part is attached to the common part. The type of product-specific part connected to the common part is determined according to the type of DUT to be tested next. Block 402 may comprise locating the product-specific part on the common part and locking it to the common part, as described above. As illustrated in FIG. 1, the connectors 20 establishing the electric connection between the common part and the product-specific part automatically connect upon locking the product-specific part to the common part. Additionally, an RF signal cable may be connected to the RF connector 204.

Upon completion of block 402, the testing station is ready for testing the DUTs. In block 404, a DUT is positioned on the product-specific part. Positioning the DUT may comprise placing the DUT on a support in the product-specific part and locking the DUT to its position with the locking elements 13 of the product-specific part. Additionally, a signaling connection may be established between the DUT and the testing station through the testing elements 17. When the product presence sensors 15 detect that the DUT is firmly positioned and the testing elements 17 indicate the signaling connection, the process moves to block 406.

In block 406, the testing station performs test procedures on the DUT. The test procedures may comprise transfer of signals between the testing station and the DUT through the signaling connection established through the wiring on the base plate (block 407). Accordingly, test signals may be transferred through the connector 200 to the elements of the product-specific part configured to test the DUT. The test procedures may also comprise transfer of RF signals between the testing station and the DUT through the antenna 12 formed by the wiring on the base plate (block 408). This way, radio communication properties of the DUT may be tested.

When block 406, i.e. the testing of the DUT, has been completed, the procedure moves to block 410 in which the DUT is removed from the product-specific part. In block 412, it is determined whether a new type of DUT or the same type of DUT is to be tested next. If testing of the same type of DUTs is continued, the procedure moves to block 404, in which a new DUT is positioned on the product-specific part. Otherwise, the procedure moves to block 414, where the product-specific part attached to the common part in block 404 is removed, and the procedure returns to block 402, in which another product-specific part is attached to the common part.

Implementing the base plate of the product-specific part as a printed wiring board replaces the need for electrical wires for connecting the testing station to the product-specific part and the DUT. This reduces the amount of 'passive' electric wires in the test adapter and saves space to other testing elements. Accordingly, more 'active' testing elements, such as probes, actuators, etc., may be introduced to the same space due to the space freed by the removal of electrical wires. Additionally, production and testing time of the DUT is reduced, which results in improved efficiency of the whole production line comprising the testing station and the test adapter according to an embodiment of the invention.

Moreover, implementing the antenna as a part of the wiring of the base plate, no additional antenna elements connected to the product-specific part with a connection PWB, for example, are needed. As a consequence, space is saved and time for assembling the product-specific part is further reduced.

It will be obvious to a person skilled in the art that, as technology advances, the inventive concept can be implemented in various ways. The invention and its embodiments are not limited to the examples described above but may vary within the scope of the claims.

The invention claimed is:

1. A base plate for a test adapter configured to enable testing of various devices in a testing station, the base plate comprising:
    a first interface configured to connect to a product-specific part comprising testing elements configured to receive and test a specific type of device under test; and
    a second interface comprising at least one connector that is configured to connect to a counterpart connector in a common part, the common part comprising testing elements common to various devices under test,
    wherein the base plate is a printed wiring board arranged to route electrical test signals through the at least one connector, when connected to the counterpart connector, from the common part to said testing elements of the product-specific part used for testing the device under test.

2. The base plate of claim 1, wherein the wiring of the base plate is further arranged to couple signals from the common part to the device under test directly.

3. The base plate of claim 1, wherein the wiring of the base plate is arranged to couple a radio frequency signal to the device under test through an antenna embedded in the base plate.

4. The base plate of claim 3, wherein at least part of the antenna is part of the printed wiring of the base plate.

5. The base plate of claim 1, wherein the base plate is detachably connectable to the common part.

6. The base plate of claim 5, wherein the base plate is detachably connectable to the common part with quick-disconnect coupling.

7. The base plate of claim 5, wherein the base plate is connectable to an electric connector of the common part with a connector counterpart disposed in the base plate.

8. The base plate of claim 1, wherein one or more sensors used in testing the device under test is embedded on the base plate.

9. The base plate of claim 8, wherein the one or more sensors comprise at least one of the following: a product presence check sensor to detect that the device under test is physically positioned by the base plate, actuator position sensor, audio sensor, light sensor, vibration sensor to sense vibrations of the device under test.

10. The base plate of claim 1, wherein the wiring of the base plate is further arranged to couple signals from the common part through the product-specific part.

11. The base plate of claim 1, wherein the device under test includes a wireless communication device.

12. The base plate of claim 1, wherein the product-specific part includes positioning elements for guiding the positioning and movement of actuators that are used for testing the device under test.

13. A test adapter comprising:
a base plate configured to be applied to a test adapter that is configured to enable testing of various devices in a testing station;
a product-specific part arranged on the base plate and comprising testing elements configured to receive and test a specific type of device under test; and
a common part connectable to the base plate and comprising testing elements common to various devices under test, wherein the base plate comprises a first interface configured to connect to the product-specific part, the base plate comprising a second interface comprising at least one connector that is configured to connect to a counterpart connector in the common part, wherein the base plate is a printed wiring board arranged to route electrical test signals through the at least one connector, when connected to the counterpart connector, from the common part to the testing elements of the product-specific part used for testing the device under test.

14. A testing station comprising:
a test adapter configured to enable testing of various devices in the testing station, the test adapter comprising:
a base plate;
a product-specific part arranged on the base plate and comprising testing elements configured to receive and test a specific type of device under test; and
a common part connectable to the base plate and comprising testing elements common to various devices under test, wherein the base plate comprises a first interface configured to connect to the product-specific part, the base plate comprising a second interface comprising at least one connector that is configured to connect to a counterpart connector in the common part, wherein the base plate is a printed wiring board arranged to route electrical test signals through the at least one connector, when connected to the counterpart connector, from the common part to the testing elements of the product-specific part used for testing the device under test.

15. A production line of a device comprising:
a testing station comprising:
a test adapter configured to enable testing of various devices in the testing station, the test adapter comprising:
a base plate;
a product-specific part arranged on the base plate and comprising testing elements configured to receive and test a specific type of device under test; and
a common part connectable to the base plate and comprising testing elements common to various devices under test, wherein the base plate comprises a first interface configured to connect to the product-specific part, the base plate comprising a second interface comprising at least one connector that is configured to connect to a counterpart connector in the common part, wherein the base plate is a printed wiring board arranged to route electrical test signals through the at least one connector, when connected to the counterpart connector, from the common part to the testing elements of the product-specific part used for testing the device under test.

* * * * *